United States Patent
Ohta et al.

(10) Patent No.: US 11,131,727 B2
(45) Date of Patent: Sep. 28, 2021

(54) MAGNETIC SENSOR DEVICE

(71) Applicant: TDK Corporation, Tokyo (JP)

(72) Inventors: Naoki Ohta, Tokyo (JP); Yongfu Cai, Tokyo (JP)

(73) Assignee: TDK Corporation, Tokyo (JP)

( * ) Notice: Subject to any disclaimer, the term of this patent is extended or adjusted under 35 U.S.C. 154(b) by 146 days.

(21) Appl. No.: 16/577,036

(22) Filed: Sep. 20, 2019

(65) Prior Publication Data

US 2020/0292636 A1 Sep. 17, 2020

(30) Foreign Application Priority Data

Mar. 11, 2019 (JP) ................ JP2019-43976

(51) Int. Cl.
*G01R 33/09* (2006.01)
*H01F 10/32* (2006.01)

(52) U.S. Cl.
CPC ....... *G01R 33/093* (2013.01); *H01F 10/3268* (2013.01)

(58) Field of Classification Search
CPC .............. H01F 10/3268; G01R 33/095; G01R 33/0017
See application file for complete search history.

(56) References Cited

U.S. PATENT DOCUMENTS

| | | |
|---|---|---|
| 6,512,660 B1 | 1/2003 | Li et al. |
| 2002/0067581 A1 | 6/2002 | Hiramoto et al. |
| 2012/0032673 A1 * | 2/2012 | Maekawa .............. B82Y 25/00 324/252 |
| 2013/0335073 A1 | 12/2013 | Deak et al. |
| 2014/0306328 A1 | 10/2014 | Mikado et al. |
| 2015/0091560 A1 * | 4/2015 | Deak .................... G01R 33/093 324/252 |
| 2016/0086877 A1 | 3/2016 | Mikado et al. |

(Continued)

FOREIGN PATENT DOCUMENTS

| | | |
|---|---|---|
| JP | 2000-512763 A | 9/2000 |
| JP | 2002-118306 A | 4/2002 |

(Continued)

OTHER PUBLICATIONS

Office Action dated Apr. 14, 2020 issued in corresponding JP patent application No. 2019-043976 (English translation only).

*Primary Examiner* — Alvaro E Fortich
(74) *Attorney, Agent, or Firm* — Posz Law Group, PLC

(57) ABSTRACT

A magnetic sensor device having a spin-valve-type magnetoresistive effect element and capable of stably applying a bias magnetic field on the free layer of the magnetoresistive effect element includes a spin-valve-type magnetoresistive effect element, a substrate on which the magnetoresistive effect element is positioned, a power source that supplies a substantially constant electric current applied on the magnetoresistive effect element, and a magnetic field generator that is connected to the electric current path of the electric current applied on the magnetoresistive effect element in series. The magnetic field generator is provided to be capable of applying a bias magnetic field on at least a portion of the magnetoresistive effect element. The magnetic field generator is close to a portion of the magnetoresistive effect element and is positioned at a different level from the substrate.

13 Claims, 5 Drawing Sheets

(56) References Cited

U.S. PATENT DOCUMENTS

2017/0011978 A1    1/2017   Mikado et al.
2018/0094950 A1    4/2018   Ohta
2018/0096908 A1    4/2018   Mikado et al.
2018/0113179 A1    4/2018   Deak et al.

FOREIGN PATENT DOCUMENTS

| JP | 2002-150518 A | 5/2002 |
| JP | 2008-046076 A | 2/2008 |
| JP | 2014-507001 A | 3/2014 |
| JP | 2014-89088 A | 5/2014 |
| JP | 6280610 B1 | 1/2018 |
| JP | 2018-517128 A | 6/2018 |
| JP | 2018-157222 A | 10/2018 |
| WO | 98/48291 A2 | 10/1998 |
| WO | 2015/107948 A1 | 7/2015 |

\* cited by examiner

MAGNETIC SENSOR DEVICE

CROSS REFERENCE TO RELATED APPLICATIONS

The present application is based on Japanese Patent Application No. 2019-43976 filed on Mar. 11, 2019, the disclosure of which is incorporated herein by reference.

TECHNICAL FIELD

The present invention relates to a magnetic sensor device.

BACKGROUND

In recent years, in a variety of applications, physical quantity detection devices (position detection devices) for detecting physical quantities (for example, position and movement amount (change amounts) or the like caused by rotational movement or linear movement of a moving body) have been used. As such a physical quantity detection device, one equipped with a magnetic sensor capable of detecting change in an external magnetic field has been known, and a sensor signal in accordance with the change in the external magnetic field is output from the magnetic sensor.

The magnetic sensor includes a magnetic sensor element for detecting a detected magnetic field, and as the magnetic sensor element, a spin-valve-type magnetoresistive effect element (AMR element, GMR element, TMR element or the like) in which resistance changes in accordance with change in the external magnetic field, or the like, has been known.

A spin-valve-type magnetoresistive element is configured by a layered structure having a free layer, the magnetization direction of which changes in accordance with an external magnetic field, a magnetization fixed layer, the magnetization direction of which is fixed, and a nonmagnetic layer interposed between the free layer and the magnetization fixed layer. In a magnetoresistive effect element having this kind of structure, the resistance value of the magnetoresistive effect element is determined by the angle formed between the magnetization direction of the free layer and the magnetization direction of the magnetization fixed layer. In addition, the magnetization direction of the free layer changes in accordance with the external magnetic field, the angle formed between the magnetization directions of the free layer and the magnetization fixed layer changes because of this, and through this, the resistance value of the magnetoresistive effect element changes. Through the change in this resistance value, a sensor signal corresponding to the change in the external magnetic field is output.

RELATED LITERATURE

Patent Literature

[PATENT LITERATURE 1] National Patent Publication No. 2014-507001
[PATENT LITERATURE 2] JP Laid-Open Patent Application No. 2002-150518
[PATENT LITERATURE 3] National Patent Publication No. 2018-517128

OVERVIEW OF THE INVENTION

Problem to be Solved by the Invention

In the above-described spin-valve-type magnetoresistive effect element, fluctuation occurs in the magnetization of the free layer in a zero magnetic field (an initial condition in which the external magnetic field has not been applied), and through this, noise is generated in the output signal of the magnetic sensor. Conventionally, a hard magnet or the like is provided near the magnetoresistive effect element in order to apply a bias magnetic field on the free layer, for the purpose of suppressing fluctuations in the magnetization of the free layer. However, there is a problem in that the structure of the magnetic sensor becomes complex. In addition, the problem exists that the magnetization direction of the hard magnet changes irreversibly and it is difficult to stably apply the desired bias magnetic field on the free layer due to the hard magnet (a magnetic sensor device with a hard magnet provided near the magnetoresistive effect element) being exposed to large external magnetic fields or a physical impact being applied to the hard magnet, or the like. In particular, the size of the hard magnet has to become smaller accompanying miniaturization of magnetic sensor, but as the size of the hard magnet becomes smaller, changes occur more readily in the magnetization direction of the hard magnet due to external magnetic fields or physical impacts.

In consideration of the foregoing, it is an object of the present invention to provide a magnetic sensor device which has a spin-valve-type magnetoresistive effect element and which can stably apply a bias magnetic field on the free layer of the magnetoresistive effect element.

Means for Solving the Problem

In order to resolve the above-described problem, the present invention provides a magnetic sensor device having a spin-valve-type magnetoresistive effect element, a substrate on which the magnetoresistive effect element is positioned, a power source that supplies a substantially constant electric current applied on the magnetoresistive effect element, and a magnetic field generator that is connected in series to the electric current path of the electric current applied on the magnetoresistive effect element and that is provided so as to be capable of applying a bias magnetic field on at least a portion of the magnetoresistive effect element. The magnetic field generator is close to the portion of the magnetoresistive effect element and is positioned at a different level than the substrate.

The above-described magnetoresistive effect element is configured in a meandering shape having a plurality of long parts that have first ends and second ends and are arranged in parallel to a prescribed direction and folded parts that are continuous between the first ends or the second ends of two long parts adjacent in the parallel direction of the long part. The magnetic field generator may be positioned close to the folded parts. The magnetoresistive effect element is configured in the meandering shape so that the plurality of folded parts that are continuous between the first ends or the second ends of the long parts are arranged parallel to a prescribed direction. The magnetic field generator may be positioned close to the plurality of folded parts. Preferably, the magnetic field generator is positioned close to the plurality of folded parts along the direction parallel to the plurality of folded parts.

The above-described magnetoresistive effect element has a plurality of magnetoresistive effect laminated bodies, which are positioned in an array with a plurality of rows and a plurality of columns, and a plurality of lead electrodes, which connect the plurality of magnetoresistive effect laminated bodies in a meandering shape in series. The lead electrodes include a first lead electrode, which connects the plurality of magnetoresistive effect laminated bodies arranged in parallel in a first direction in series, and a second lead electrode, which connects the magnetoresistive effect laminated bodies positioned at both ends in the first direction in a second direction orthogonal to the first direction. The long part is configured by a plurality of magnetoresistive effect laminated bodies arranged in parallel to the first direction and the first lead electrode. The folded parts may be configured by the magnetoresistive effect laminated bodies positioned at both ends in the first direction. The shape of the second lead electrode in a plan view can be approximately U-shaped.

The above-described magnetic field generator may be positioned at a prescribed gap above the magnetoresistive effect element positioned on the substrate. A sealing part integrally seals at least the magnetoresistive effect element with resin. The magnetic field generator may be positioned at a level differing from the substrate by the resin being interposed between the magnetic field generator and the magnetoresistive effect element.

As the magnetoresistive effect element, a TMR element or a GMR element can be used.

Efficacy of the Invention

With the present invention, it is possible to provide a magnetic sensor device which has a spin-valve-type magnetoresistive effect element and which can stably apply a bias magnetic field on the free layer of the magnetoresistive effect element.

EMBODIMENT(S) OF THE INVENTION

Figure 1:
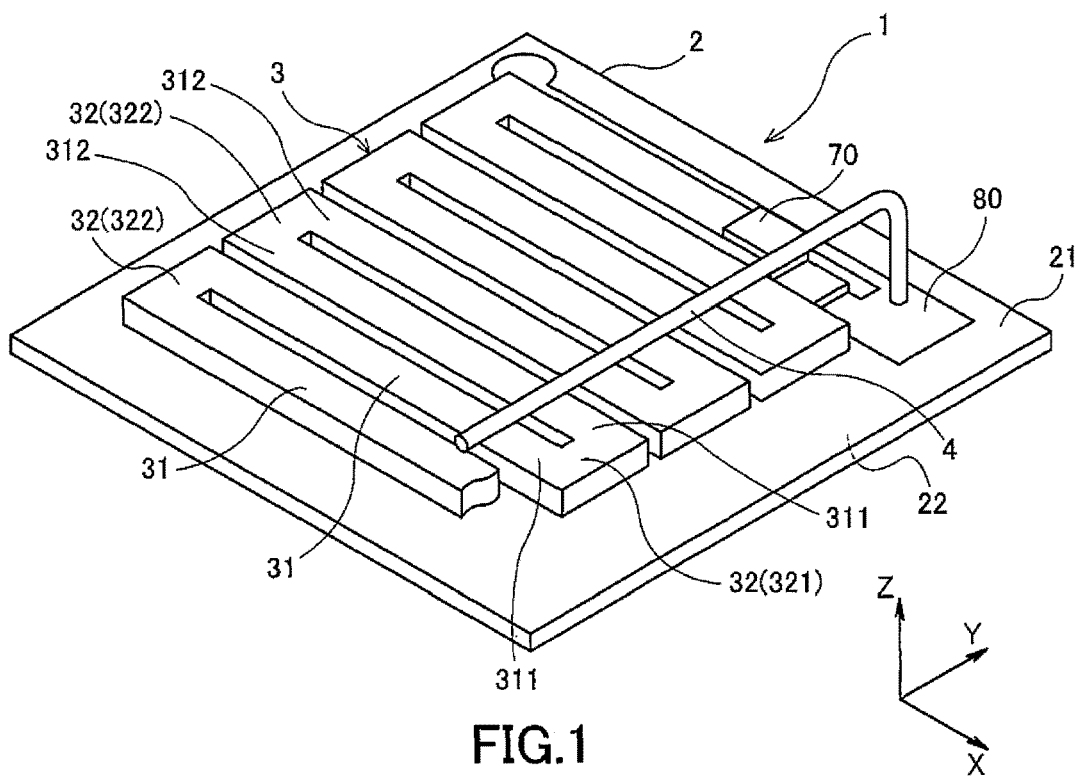
FIG. 1 is a perspective view showing a schematic configuration of one aspect of the magnetic sensor device according to an embodiment of the present invention.
Figure 2:
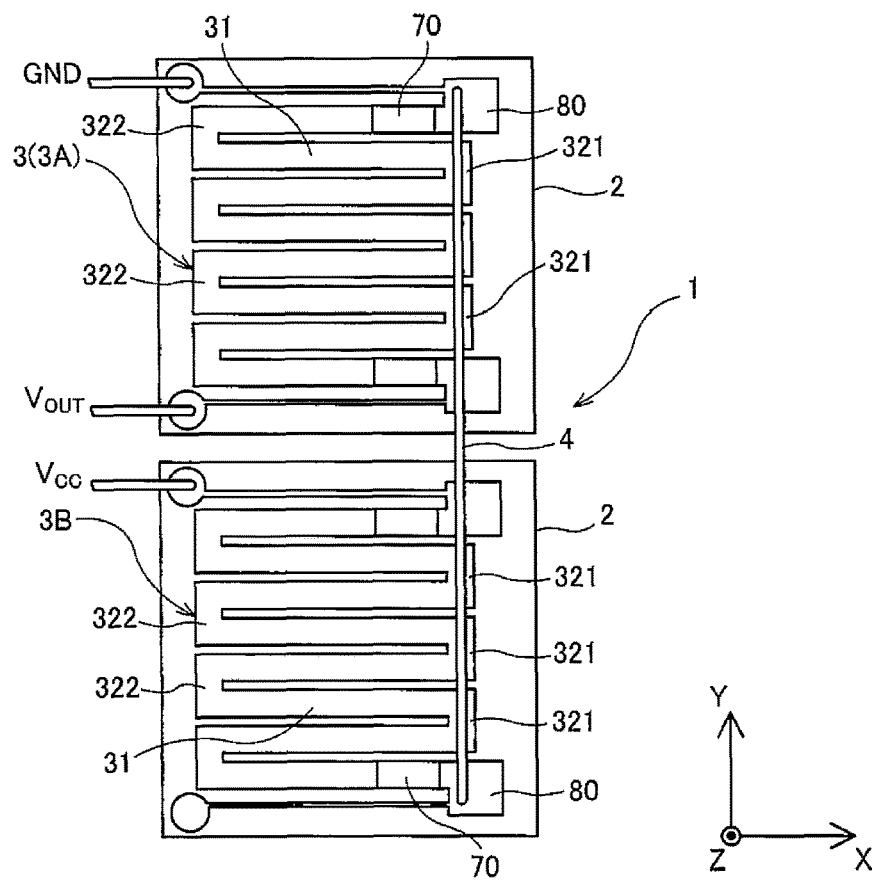
FIG. 2 is a plan view showing a schematic configuration of one aspect of the magnetic sensor device according to an embodiment of the present invention.
Figure 3:
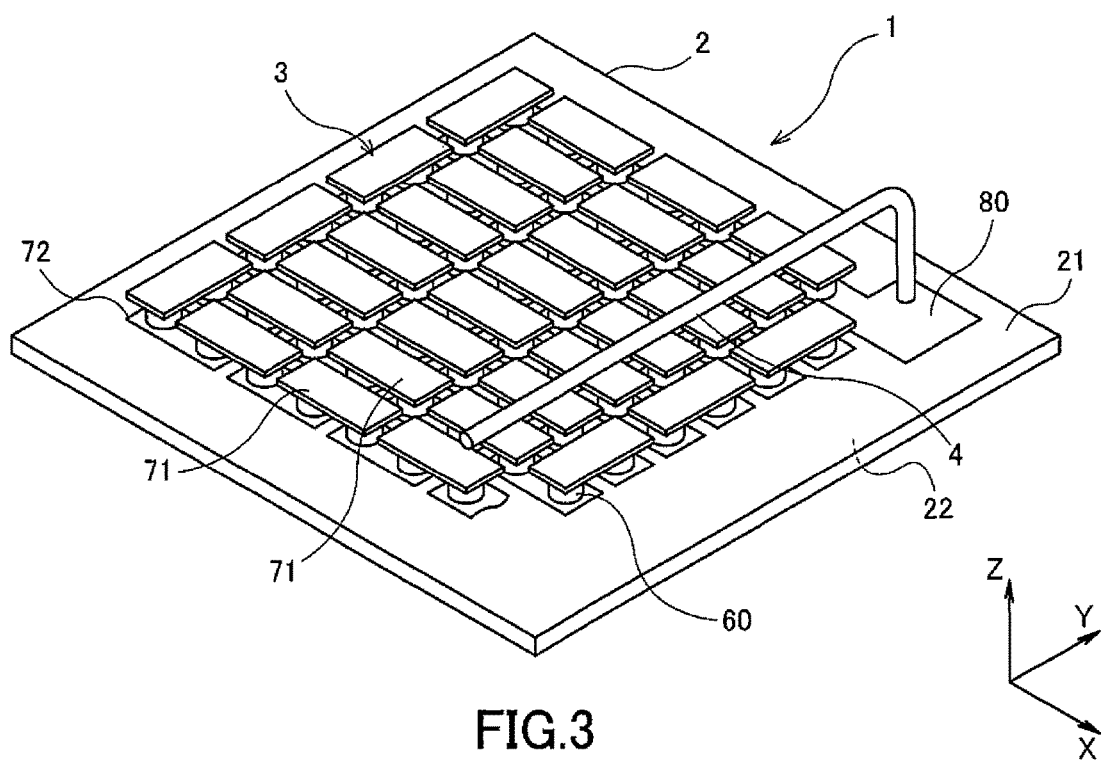
FIG. 3 is a perspective view showing a schematic configuration of another aspect (first) of the magnetic sensor device according to an embodiment of the present invention.
Figure 4:
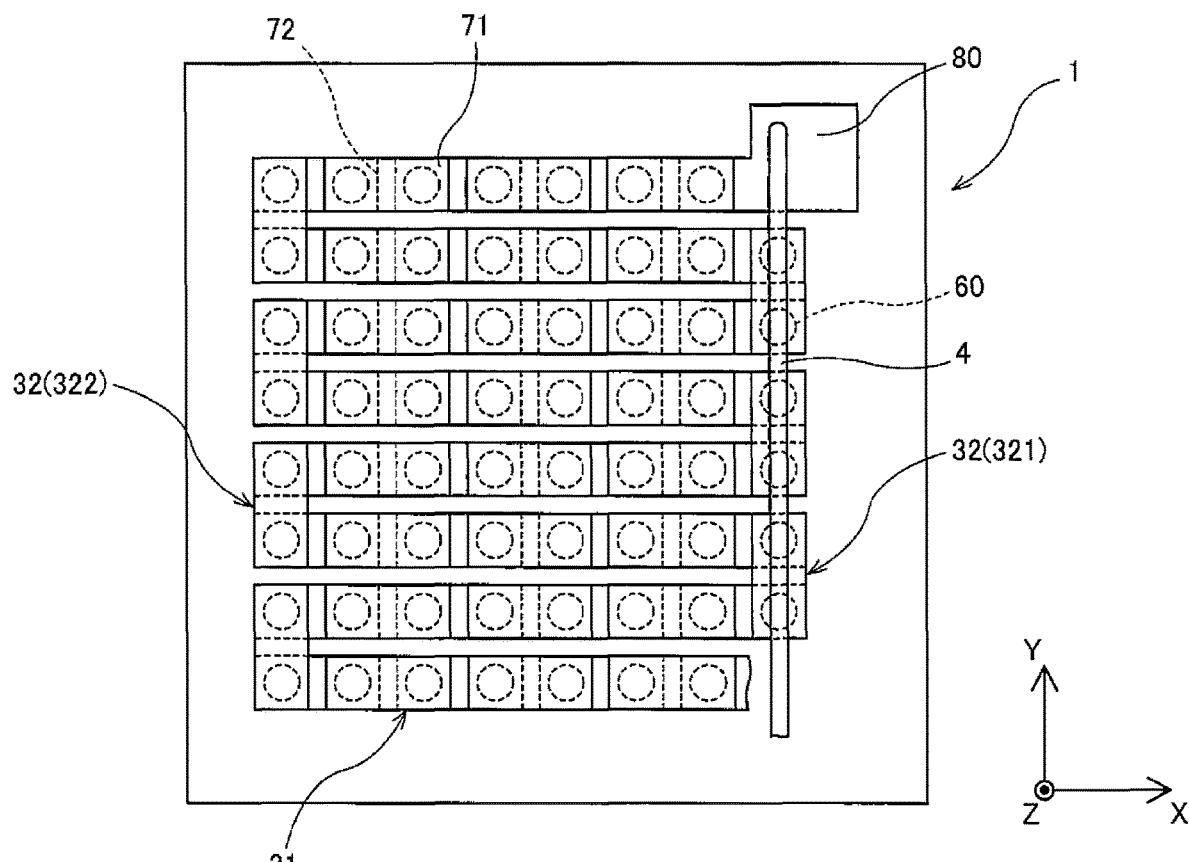
FIG. 4 is a plan view showing a schematic configuration of another aspect (first) of the magnetic sensor device according to an embodiment of the present invention.
Figure 5:
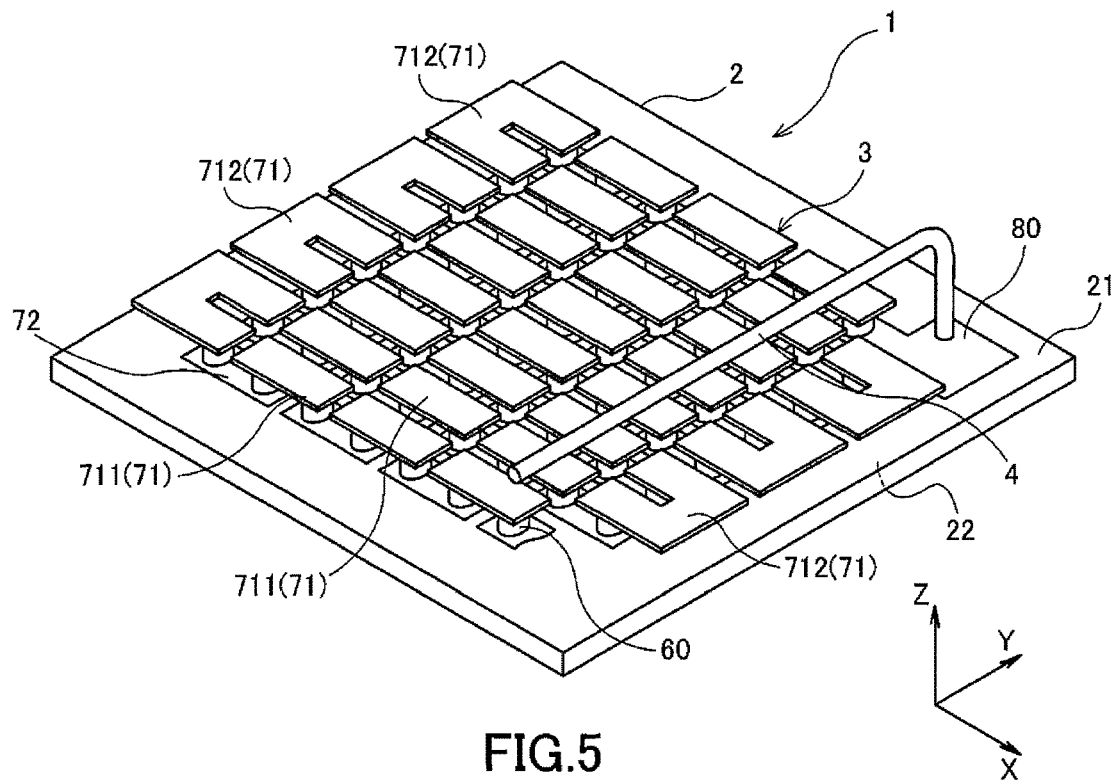
FIG. 5 is a perspective view showing a schematic configuration of another aspect (second) of the magnetic sensor device according to an embodiment of the present invention.
Figure 6:
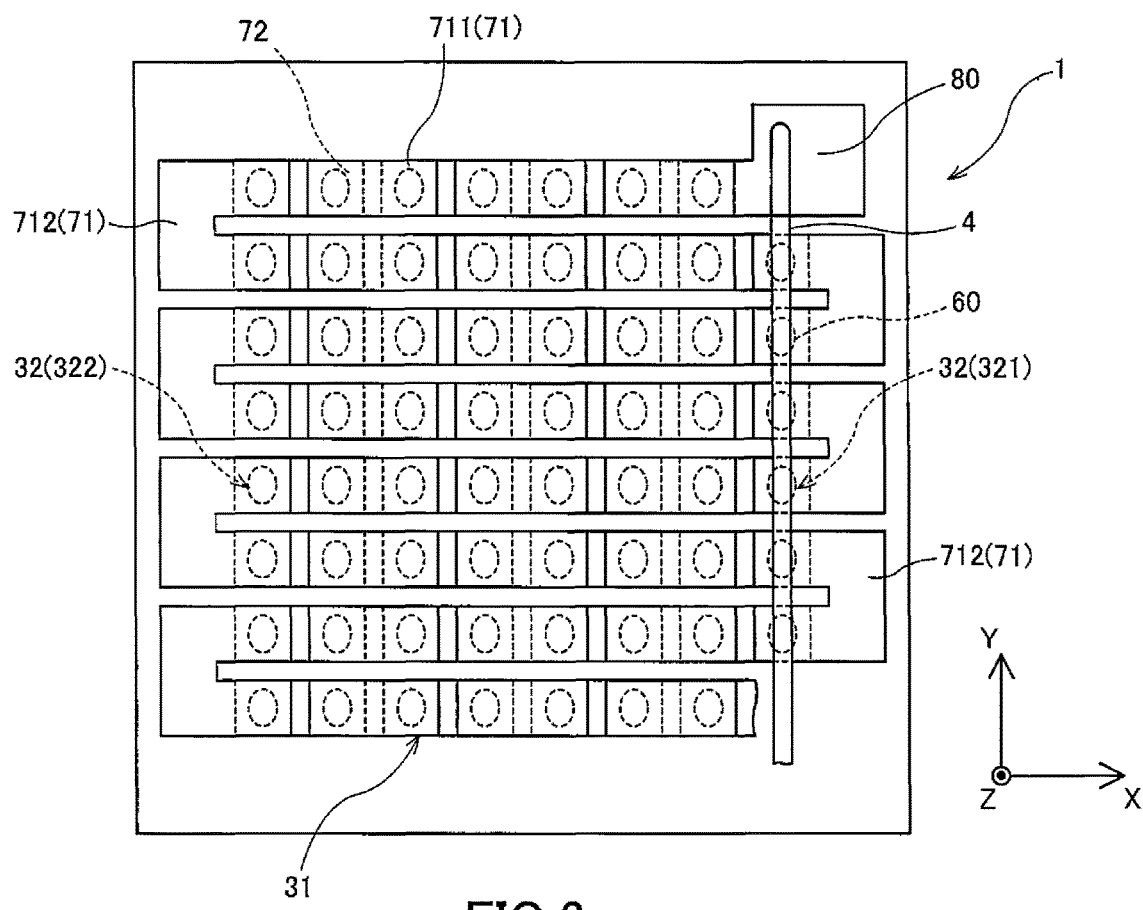
FIG. 6 is a plan view showing a schematic configuration of another aspect (first) of the magnetic sensor device according to an embodiment of the present invention.
Figure 7:
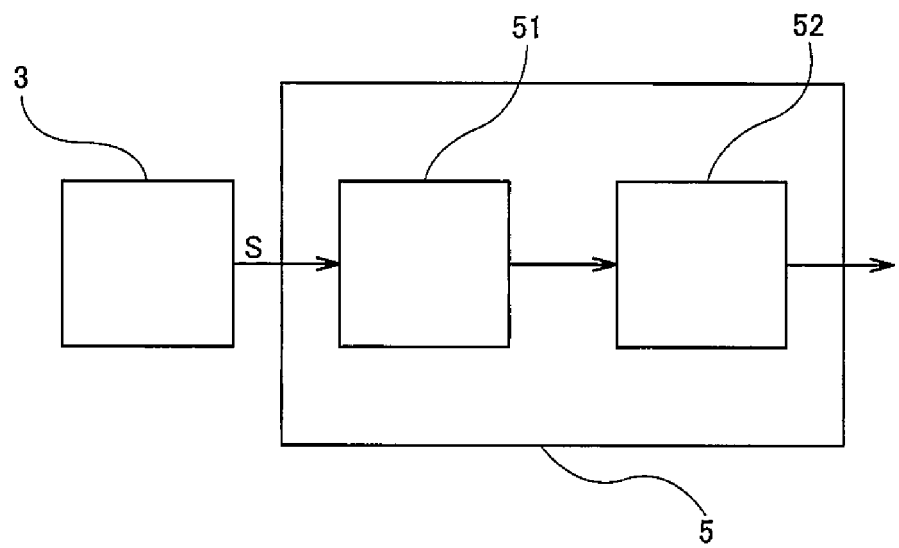
FIG. 7 is a block diagram showing a schematic configuration of the magnetic sensor device according to an embodiment of the present invention.
Figure 8:
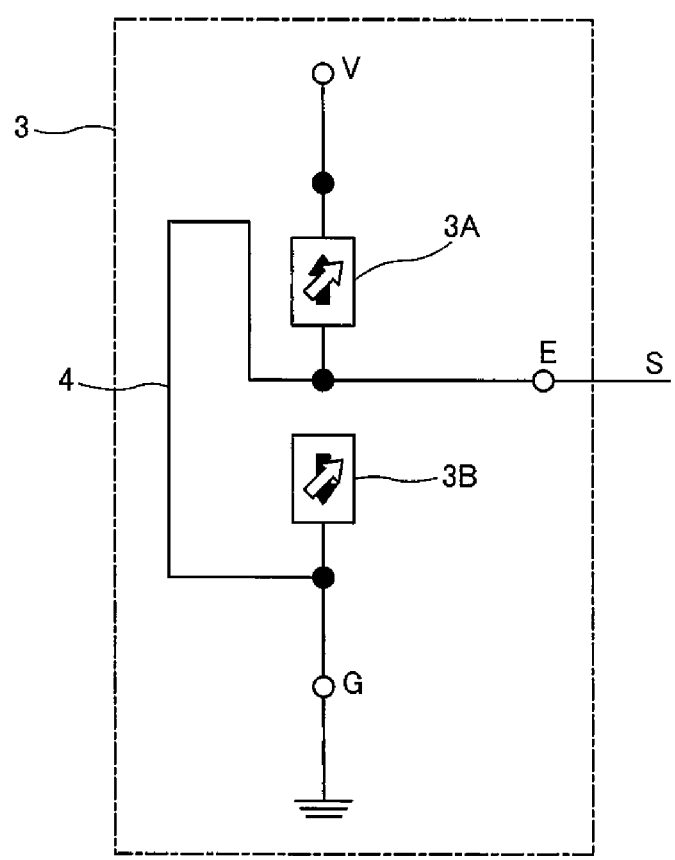
FIG. 8 is a circuit diagram showing a schematic configuration of an aspect of the circuit configuration possessed by the magnetic sensor device according to an embodiment of the present invention.
Figure 9:
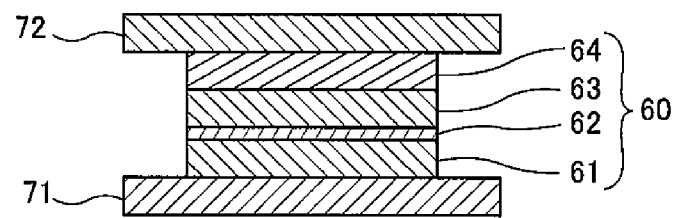
FIG. 9 is a cross-sectional view showing a schematic configuration of the magnetoresistive effect element according to an embodiment of the present invention.
Figure 10:
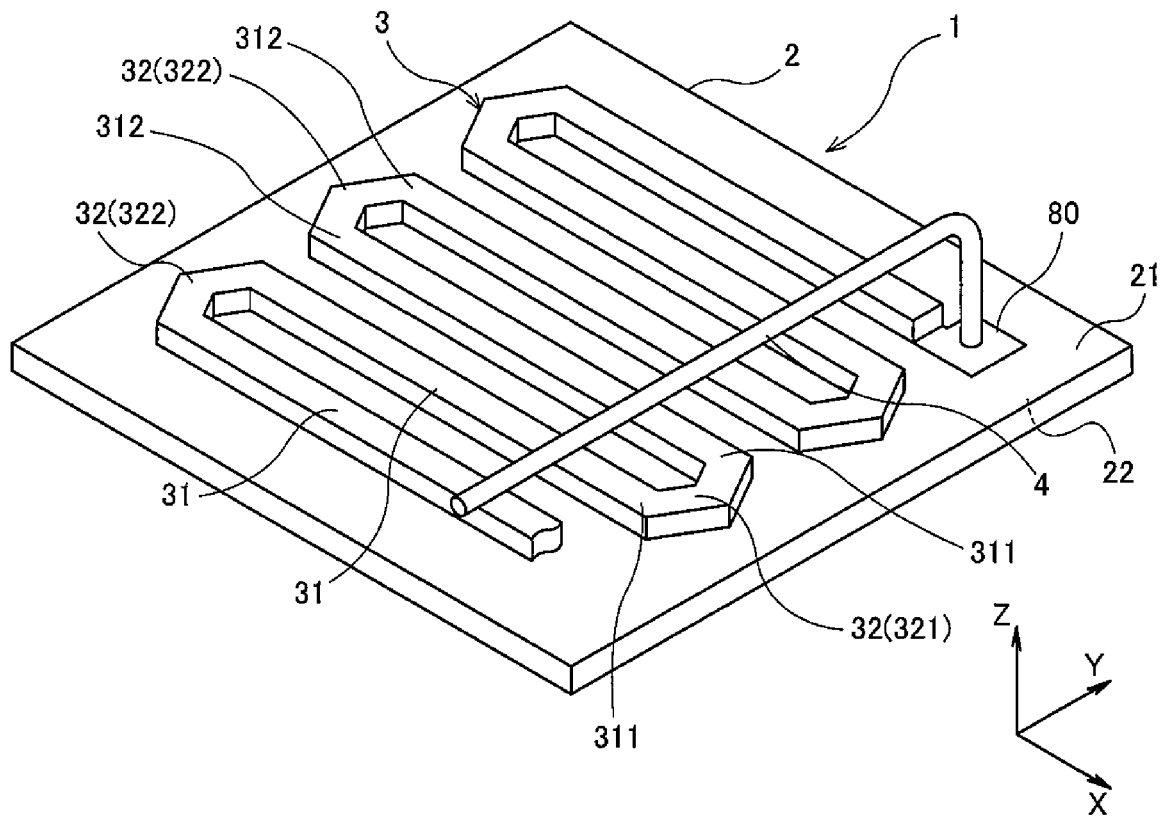
FIG. 10 is a plan view showing a schematic configuration of another aspect (second) of the magnetic sensor according to an embodiment of the present invention.

An embodiment of the present invention will be described with reference to the drawings. FIG. 1 is a perspective view showing a schematic configuration of one aspect of the magnetic sensor device according to this embodiment, FIG. 2 is a plan view showing a schematic configuration of one aspect of the magnetic sensor device according to this embodiment, FIG. 3 is a perspective view showing a schematic configuration of another aspect of the magnetic sensor device according to this embodiment, FIG. 4 is a plan view showing a schematic configuration of another aspect of the magnetic sensor device according to this embodiment, FIG. 6 is a block diagram showing a schematic configuration of the magnetic sensor device according to this embodiment, FIG. 7 is a circuit diagram showing a schematic configuration of an aspect of the circuit configuration possessed by the magnetic sensor device according to this embodiment, and FIG. 8 is a cross-sectional view showing a schematic configuration of the magnetoresistive effect element according to an embodiment of the present invention.

In the magnetic sensor according to this embodiment, the "X-axis direction, Y-axis direction and Z-axis direction" are defined in a number of the drawings as necessary. Here, the X-axis direction and the Y-axis direction are mutually orthogonal directions within the plane substantially parallel to a first surface and a second surface of the substrate in this embodiment, and the Z-axis direction is the direction of thickness of the substrate (the direction orthogonal to the first surface and the second surface of the substrate).

A magnetic sensor device 1 according to this embodiment includes a substrate 2 which includes a first surface 21 and a second surface 22 facing the first surface, a magnetoresistive effect element 3 provided on the first surface 21 of the substrate 2, a bias magnetic field generator 4 that can apply a bias magnetic field on a portion of the magnetoresistive effect element 3, a calculation processor 5 that calculates a physical quantity based on an output signal from magnetoresistive effect element 3, and a sealing part (undepicted) that integrally seals the substrate 2, the magnetoresistive effect element 3, the bias magnetic field generator 4 and the calculation processor 5 with a sealing resin as a whole to form a chip. The sealing part may integrally resin-seal at least the substrate 2, the magnetoresistive effect element 3 and the bias magnetic field generator 4.

The substrate 2 may be a rectangular substrate on which the magnetoresistive effect element 3 can be mounted, and, for example, it may be a semiconductor substrate such as a silicon wafer or the like, a ceramic substrate such as an AlTiC substrate, an alumina substrate or the like, a resin substrate, a glass substrate, or the like. Insulating layers including $Al_2O_3$ or the like are provided on the first surface 21 of the substrate 2 in accordance with the type of the substrate 2.

In this embodiment, the magnetoresistive effect element 3 is of the spin-valve type. As this kind of magnetoresistive effect element 3, it is possible to use an MR element such as a TMR element, GMR element or the like, for example. The magnetoresistive effect element 3 has an MR laminated body 60 that includes a free layer 61, a nonmagnetic layer 62, a magnetization fixed layer 63 and an antiferromagnetic layer 64 layered in that order from the substrate 2 side (see FIG. 7). The antiferromagnetic layer 64 is configured by an antiferromagnetic material and serves the role of fixing the direction of magnetization of the magnetization fixed layer 63, by causing exchange coupling with the magnetization fixed layer 63. The magnetoresistive effect element 3 may have a configuration in which the antiferromagnetic layer 64, the magnetization fixed layer 63, the nonmagnetic layer 62 and the free layer 61 are layered in that order from the substrate 2 side. In addition, the antiferromagnetic layer 64 may be omitted if the magnetization fixed layer 63 has a layered ferri-structure of a ferromagnetic layer/nonmagnetic intermediate layer/ferromagnetic layer and a so-called self-pinned fixed layer (Synthetic Ferri Pinned layer, or SFP layer), in which both ferromagnetic layers are antiferromagnetically coupled.

In a TMR element, the nonmagnetic layer 62 is a tunnel barrier layer. In a GMR element, the nonmagnetic layer 62 is a nonmagnetic electroconductive layer. In a TMR element or GMR element, the resistance value changes in accordance with the angle formed by the direction of magnetization of the free layer 61 with respect to the direction of magnetization of the magnetization fixed layer 63. The resistance value becomes a minimum when this angle is 0° (when the magnetization directions are parallel to each other), and the resistance value becomes a maximum when the angle is 180° (when the magnetization directions are antiparallel to each other).

The magnetoresistive effect element 3 has a plurality of long parts 31 having a first end 311 and a second end 312 and extending along a first direction (the X-axis direction), and folded parts 32 that link the ends (first end 311 and second end 312) of the plurality of long parts 31 and configure the magnetoresistive effect element 3 into a meandering shape. The folded parts 32 include a plurality of first folded parts 321 linking the first ends 311 of the plurality of long parts 31 adjacent in a second direction (Y-axis direction), and a plurality of second folded parts 322 that link the second ends 312. The long parts 31, the first folded parts 321 and the second folded parts 322 are all arranged in parallel to be aligned along the second direction (Y-axis direction). The first folded parts 321 and the second folded parts 322 may not be aligned along the second direction (Y-axis direction). A GMR element as the magnetoresistive effect element 3 in general has a relatively low element resistance value, so it is necessary to make the line width narrow and the line length long in order to output a signal of a prescribed intensity from the magnetic sensor device 1. Furthermore, in order to reduce the line width of the GMR element and increase the line length within a limited region on the first surface 21 of the second substrate 2, the GMR element is preferably configured in the above-described meandering shape. In addition, a TMR element as the magnetoresistive effect element 3 in general has a relatively high element resistance value, so it is possible to realize high voltage performance by connecting many TMR elements in series, and it is possible to output a signal of prescribed intensity from the magnetic sensor device 1. Furthermore, in order to connect many TMR elements in series within a limited region on the first surface 21 of the substrate 2, the TMR elements are preferably configured in the above-described meandering shape.

The magnetoresistive effect element 3 configured in the meandering shape may be such that the entirety thereof is configured by the MR laminated body 60 with a pad (electrode pad) 80 connected to one end of the MR laminated body 60 in a meandering shape via a lead electrode 70 or the like (see FIG. 1 and FIG. 2) or may have a configuration in which a plurality of MR laminated bodies 60 that are approximately circular in a plan view are connected in series in a meandering shape via upper lead electrodes 71 and lower lead electrodes 72 (see FIGS. 3-6). The lead electrode 70 (see FIG. 1, FIG. 2) and the upper lead electrodes 71 and lower lead electrodes 72 (see FIGS. 3-6) are configured by one type of electroconductive material out of Cu, Al, Au, Ta, Ti, or the like, or a composite film of two or more types of electroconductive materials. The shape of the MR laminated body 60 is not limited to an approximately circular shape in a plan view and may also be an approximately oval shape in a plan view (see FIG. 5 and FIG. 6) or an approximately rectangular shape in a plan view. In the aspect shown in FIGS. 3-6, the plurality of lower lead electrodes 72 is provided on the substrate 2. Each of the lower lead electrodes 72 has a long, slender, approximately rectangular shape, and is provided so that there is a prescribed gap between two lower lead electrodes 72 adjacent in the electrical series direction of the plurality of MR laminated bodies 60 arranged in an array. At each of the two ends of the lower lead electrodes 72 in the lengthwise direction, MR laminated bodies 60 are provided. That is, two MR laminated bodies 60 are provided on each of the plurality of lower lead electrodes 72.

The plurality of upper lead electrodes 71 is provided on the plurality of MR laminated bodies 60. In the aspect shown in FIG. 3 and FIG. 4, each of the upper lead electrodes 71 has a long, slender, approximately rectangular shape. The upper lead electrodes 71 are arranged so that there is a prescribed gap between two upper lead electrodes 71 adjacent in the electrical series direction of the plurality of MR laminated bodies 60 arranged in an array and such that the MR laminated bodies 60 are connected in series in the meandering shape. The antiferromagnetic layers 64 of two adjacent MR laminated bodies 60 are electrically connected. In the aspect shown in FIG. 5 and FIG. 6, the upper lead electrodes 71 include first upper lead electrodes 711 having a long, slender, approximately rectangular shape that connect in series the MR laminated bodies 60 and are arranged in parallel in the X-axis direction. Approximately U-shaped second upper lead electrodes 712 are positioned at both ends of each of the long parts 31 and electrically connect two MR laminated bodies 60 adjacent in the Y-axis direction. Each of the MR laminated bodies 60 is connected in series in the meandering shape by the first upper lead electrodes 711 and the second upper lead electrodes 712. The long parts 31 are configured by the plurality of MR laminated bodies 60 arranged parallel in the X-axis direction and the first upper lead electrodes 711 connecting such in series. The MR laminated body 60 located at both ends and the second upper lead electrode 712 connecting them in the Y-axis direction constitute a folded portion 32 (first folded portion 321 and second folded portion 322). A gap layer (protective layer) may be provided between the free layer 61 and the lower lead electrode 72 or the upper lead electrode 71.

In this embodiment, the circuit configuration of the magnetic sensor device 1 may be a half-bridge circuit in which magnetoresistive effect elements 3 respectively provided on the first surface 21 of two substrates 2 (first magnetoresistive effect element 3A and second magnetoresistive effect element 3B) are connected in series (see FIG. 2, FIG. 6), or may be a Wheatstone bridge circuit in which four magnetoresistive effect elements 3 (first through fourth magnetoresistive effect elements), namely two magnetoresistive effect elements 3 (first magnetoresistive effect element and second magnetoresistive effect element) provided on the first surface 21 of one substrate 2 and two magnetoresistive effect elements 3 (third magnetoresistive effect element and fourth magnetoresistive effect element) provided on the first surface 21 of another substrate 2, are bridge connected. In the Wheatstone bridge circuit, each of the four magnetoresistive effect elements 3 (first through fourth magnetoresistive effect elements) may be provided on the first surface 21 of a separate substrate 2.

The half-bridge circuit includes a power source port V, a ground port G, an output port E, and a first magnetoresistive effect element 3A and a second magnetoresistive effect element 3B connected in series. One end of the first magnetoresistive effect element 3A is connected to the power source port V. The other end of the first magnetoresistive effect element 3A is connected to one end of the second magnetoresistive effect element 3B and to the output port E. The other end of the second magnetoresistive effect element 3B is connected to the ground port G. A power source voltage (constant current) of a prescribed magnitude is applied on the power source port V by connecting a constant-voltage source Vcc, and the ground power G is connected to ground GND.

In this embodiment, the magnetization direction of the magnetization fixed layer 63 of the first magnetoresistive effect element 3A (the filled-in arrow shown in FIG. 8) and the magnetization direction of the magnetization fixed layer 63 of the second magnetoresistive effect element 3B (the filled-in arrow shown in FIG. 8) are antiparallel to each other. The magnetization direction of the free layer 61 of the first magnetoresistive effect element 3A in an initial state (a state in which the external magnetic field is not impressed) (the white arrow shown in FIG. 8) and the magnetization direction of the free layer 61 of the second magnetoresistive effect element 3B (the white arrow shown in FIG. 8) are parallel to each other and are orthogonal to the magnetization direction of the magnetization fixed layer 63. By the magnetization directions of the magnetization fixed layers 63 and the free layers 61 of the first magnetoresistive effect element 3A and the second magnetoresistive effect element 3B being the above-described directions, the potential difference at the output port E changes accompanying changes in the resistance value of the magnetoresistive effect element 3 (the first magnetoresistive effect element 3A and the second magnetoresistive effect element 3B) in accordance with the external magnetic field, and a signal is output as the change in the electric potential difference.

In this embodiment, one end of the magnetoresistive effect element 3 is connected to a pad (electrode pad 80) formed on the first surface 21 of the substrate 2. A constant electric current source, for example, is connected to the pad (electrode pad) 80 via a bonding wire 4. This bonding wire 4 is fixed to the pad (electrode pad) 80 to extend over one portion of the magnetoresistive effect element 3 formed in a meandering shape on the first surface 21 of the substrate 2. More specifically, the bonding wire 4 overlaps the first folded part 321 of the magnetoresistive effect element 3 in a meandering shape, when viewed from above the first surface 21 of the substrate 2.

In the magnetoresistive effect element 3, fluctuations occur in the magnetization of the free layer 61 in a zero magnetic field (an initial state in which no external magnetic field is applied). By having the bonding wire 4 extend over above a portion of the magnetoresistive effect element 3, a magnetic field (bias magnetic field) generated by electric current flowing through the bonding wire 4 is applied on the magnetoresistive effect element 3. As a result, it is possible to suppress fluctuations in the magnetization of the free layer 61. That is, the bonding wire 4 extending over a portion of the magnetoresistive effect element 3 is an electric current path and is a bias magnetic field generator 4 for applying a bias magnetic field on the magnetoresistive effect element 3.

The electric current flowing in the bonding wire 4 is a constant electric current supplied from the constant electric current source, so the intensity of the magnetic field (electric current magnetic field) generated by the bonding wire 4 is approximately constant, and the direction in which that magnetic field is applied on the magnetoresistive effect element 3 is also approximately constant. Consequently, in this embodiment, even if the magnetic sensor device 1 (the bonding wire 4) is exposed to a large external magnetic field or a physical impact is applied to the magnetic sensor device 1 (the bonding wire 4), the magnetic field generated by the bonding wire 4 (bias magnetic field) can be applied stably on the magnetoresistive effect element 3.

In addition, the electric current direction in the long part 31 of the magnetoresistive effect element 3, which has meandering shape, and the electric current direction in the folded part 32 (the first folded part 321 and the second folded part 322) are different from each other. The electric current direction in the long part 31 is substantially parallel to the first direction (the X-axis direction). In contrast, the electric current direction in the folded part 32 (the first folded part 321 and the second folded part 322) is in a direction (the second direction (the Y-axis direction) substantially orthogonal to the first direction (the X-axis direction) or an intersecting direction. In this manner, the electric current directions of the long part 31 and the folded part 32 (the first folded part 321 and the second folded part 322) differ from each other. Through this, the resistance value change in the long part 31 in accordance with the external magnetic field and the resistance value change in the folded part 32 (the first folded part 321 and the second folded part 322) in accordance with the external magnetic field differ. The output voltage from the magnetoresistive effect element 3 is a value in accordance with the change in the resistance value of the magnetoresistive effect element 3 as a whole, but the resistance value change in the folded part 32 (the first folded part 321 and the second folded part 322) appears as noise. In this embodiment, by having the bonding wire 4 extend over the folded part 32 (the first folded part 321) of the magnetoresistive effect element 3, which has the meandering shape, a relatively strong bias magnetic field is applied on the folded part 32 (the first folded part 321) relatively close to the bonding wire 4. Consequently, the magnetization direction of the free layer 61 of the folded part 32 (the first folded part 321) becomes difficult to change even if the external magnetic field to be detected is applied. On the other hand, a relatively weak bias magnetic field is applied on the long part 31 relatively far from the bonding wire 4. Consequently, the magnetization direction of the free layer 61 of the long part 31 changes in accordance with the application of the external magnetic field to be detected. Consequently, the contribution rate of the resistance value change in the folded part 32 (the first folded part 321 and the second folded part 322) becomes relatively small in the resistance value change of the entirety of the magnetoresistive effect element 3. As a result, the noise (the resistance value change in the folded part 32 (the first folded part 321 and the second folded part 322)) that appears in the output voltage from the magnetoresistive effect element 3 can be reduced, and the detection precision in the magnetic sensor device 1 can be improved. The electric current direction means the direction of flow of the electric current when the flow of electric current in the magnetoresistive effect element 3 (the long part 31 and the folded part 32 (the first folded part 321 and the second folded part 322)) is projected onto an arbitrary plane parallel to the XY plane (the plane formed by the X-axis and the Y-axis).

Furthermore, when the magnetization direction of the magnetization fixed layer 63 of the magnetoresistive effect element 3 is the X-axis direction and the magnetization direction of the free layer 61 is not orthogonal, the magnetization direction of the free layer 61 can be corrected to be orthogonal to the magnetization direction of the fixed layer

63, through the bias magnetic field applied from the bonding wire 4. For example, when the magnetization direction of the magnetization fixed layer 63 of the magnetoresistive effect element 3 is the −X direction and the angle formed between the magnetization directions of the magnetization fixed layer 63 and the free layer 61 exceeds 90° (for example, more than 90° but not greater than 100°), or when the magnetization direction of the magnetization fixed layer 63 of the magnetoresistive effect element 3 is the +X direction and the angle formed between the magnetization directions of the magnetization fixed layer 63 and the free layer 61 is less than 90° (for example, at least 80° but less than 90°), if an electric current flows in the +Y direction in the bonding wire 4, a bias magnetic field in the −X direction is generated from the bonding wire 4 and is applied on the magnetoresistive effect element 3. Through this, the magnetization direction of the free layer 61 can be corrected to be orthogonal to the magnetization direction of the magnetization fixed layer 63.

And furthermore, in this embodiment, the magnetic field generated from the bonding wire 4 can be applied on the magnetoresistive effect element 3. Consequently, implementing a self-test for the magnetic sensor device 1 is possible by adjusting the electric current value flowing in the bonding wire 4. Specifically, in a state in which there is a zero magnetic field (the initial state in which no external magnetic field is applied) or an external magnetic field of a prescribed intensity is continuously applied without the intensity thereof changing, an electric current is supplied from the constant electric current power source to the magnetic sensor device 1 and the electric current flows in the bonding wire 4. The applied voltage Vdd is caused to fluctuate within a prescribed range, and the output voltage Vout at each of the applied voltages Vdd is found. Then, by comparing the ratio of the output voltage Vout to the applied voltage Vdd (Vout/Vdd) to a prescribed constant ($\frac{1}{2}+\frac{1}{2}\times$ kRS), the properties of the magnetic sensor device 1 can be evaluated.

Here, k expresses "a constant between the electric current value $I_4$ (mA) flowing in the bonding wire 4 and the magnetic field $H_4$ (mT) generated from the bonding wire 4 ($H_4 = k \times I_4$), R expresses "the resistance value (Ω) of the magnetoresistive effect element 3 calculated from the applied voltage Vdd and the electric current value supplied from the constant electric current power source", and S expresses "the designed value of the sensitivity of the magnetic sensor device 1."

Above the magnetoresistive effect element 3, the bonding wire 4 is preferably provided to be approximately parallel to the first surface 21 of the substrate 2. If the bonding wire 4 is not approximately parallel to the first surface 21 of the substrate 2, the distance from each of the folded parts 32 (first folded parts 321) of the magnetoresistive effect element 3 to the bonding wire 4 differs, so the intensity of the bias magnetic field applied on the free layer 61 of each folded part 32 (first folded part 321) differs. However, by having the bonding wire 4 be approximately parallel to the first surface 21 of the substrate 2, it is possible to make the distance from each of the folded parts 32 (first folded parts 321) to the bonding wire 4 approximately constant. Consequently, the intensity of the bias magnetic field applied on the free layer 61 of each of the folded parts 32 (first folded parts 321) can be made substantially the same.

The gap between the magnetoresistive effect element 3 and the bonding wire 4 (the gap in the Z-axis direction) may be appropriately set so that fluctuations in the magnetization of the free layer 61 of the magnetoresistive effect element 3 are reduced and preferably so that regardless of the absence or presence of an external magnetic field, a bias magnetic field that can reduce fluctuations in the resistance value in the folded parts 32 (first folded parts 321) is applied. In this embodiment, the magnetoresistive effect element 3 and the bonding wire 4 are integrated by the sealing part. That is, sealing resin that configures the sealing part is positioned in these gaps. Through this, the bonding wire 4 is positioned at a different level from the magnetoresistive effect element 3 via the sealing resin.

The calculation processor 5 includes an A/D (analog-digital) converter 51, which converts the analog signal (sensor signal S) output from the magnetoresistive effect element 3 into a digital signal, and a calculator 52, which does calculation processing on the digital signal converted to digital by the A/D converter 51. As calculation results from the calculator 52, a signal corresponding to the external magnetic field can be output.

The A/D converter 51 converts the sensor signal S output from the magnetoresistive effect element 3 into a digital signal, and this digital signal is input into the calculator 52. The calculator 52 accomplishes calculation processing on the digital signal converted from the analog signal by the A/D converter 51. This calculator 52 is configured by, for example, a microcomputer, an Application Specific Integrated Circuit (ASIC), or the like.

In the magnetic sensor device 1 having the above-described configuration, the bonding wire 4, which also has the function of a bias magnetic field generator 4, applies a bias magnetic field on the magnetoresistive effect element 3 and is positioned at a different level from the magnetoresistive effect element 3 (above the magnetoresistive effect element 3). Consequently, it is possible to stably apply the bias magnetic field on the free layer 61 of the magnetoresistive effect element 3, and it is possible to suppress fluctuations (variance) in the magnetization of this free layer 61.

In addition, in the above-described magnetic sensor device 1, the above-described bonding wire 4 is positioned above the folded parts 32 (first folded parts 321) of the magnetoresistive effect element 3 configured in a meandering shape. Through this, it is possible to reduce noise (changes in the resistance value in the folded parts 32 (first folded parts 321) that appears in the output voltage from the magnetoresistive effect element 3, and it is possible to improve the detection precision in the magnetic sensor device 1.

The above-described embodiment is for facilitating understanding of the present invention and is not described for limiting the present invention. Accordingly, all elements disclosed in the above-described embodiment shall be construed to include all design modifications and equivalents falling within the technical scope of the present invention.

In the above-described embodiment, the magnetic sensor device 1 has a constant electric current source as a power source, a constant electric current from this constant electric current source flows in the bonding wire 4. Through this, a stable bias magnetic field (electric current magnetic field) is applied on the free layer 61 of the magnetoresistive effect element 3, but the present invention is not limited to this aspect as long as the electric current flowing in the bonding wire 4 is substantially constant. For example, the magnetic sensor device 1 may have a constant voltage source as the power source. In the magnetic sensor device 1 according to the above-described embodiment, the resistance values of each of the magnetoresistive effect elements 3 (for example, the first magnetoresistive effect element 3A and the second magnetoresistive effect element 3B) differ from each other through changes in the magnetization direction of the free layer 61 in accordance with the applied external magnetic field, but the combined resistance value of the plurality of magnetoresistive effect elements 3 as a whole is substantially constant. Consequently, by having a constant voltage source as the power source and having electric current with a constant voltage flow in the bonding wire 4, a substantially constant current flows in the bonding wire 4. As a result, the bias magnetic field (electric current magnetic field) can be applied on the free layer 61 of the magnetoresistive effect element 3.

In the above-described embodiment, the description took as an example an aspect in which the bonding wire 4 is provided above the first folded parts 321 of the magnetoresistive effect element 3, but this is not limiting. For example, in the magnetic sensor device 1, the bonding wire 4 may be provided above the second folded parts 322 of the magnetoresistive effect element 3, or the bonding wire 4 may be provided above each of the first folded parts 321 and the second folded parts 322.

In the above-described embodiment, the first folded parts 321 and the second folded parts 322 of the magnetoresistive effect element 3 are folded in a direction orthogonal to the lengthwise direction of the long part 31 and link the first ends 311 and the second ends 312 (see FIGS. 1-4), but this is not limited to this aspect. For example, as shown in FIG. 8, the first folded parts 321 and the second folded parts 322 may have an approximately V-shape or approximately U-shape linking the first ends 311 and the second ends 312 of the long part 31.

DESCRIPTION OF REFERENCE SYMBOLS

1 Magnetic sensor device
2 Base material
21 First surface
22 Second surface
3 Magnetoresistive effect element
31 Long part
32 Folded part
321 First folded part
322 Second folded part
3A First magnetoresistive effect element
3B Second magnetoresistive effect element
4 Bias magnetic field generator (bonding wire)

The invention claimed is:

1. A magnetic sensor device, comprising:
a spin-valve-type magnetoresistive effect element;
a substrate on which the magnetoresistive effect element is positioned;
a power source that supplies a substantially constant electric current applied on the magnetoresistive effect element;
a magnetic field generator that is connected in series to the electric current path of the electric current applied on the magnetoresistive effect element and that is provided to be capable of applying a bias magnetic field on at least a portion of the magnetoresistive effect element; and
a sealing part that integrally seals at least the magnetoresistive effect element and the magnetic field generator with resin,
wherein the magnetic field generator is close to the portion of the magnetoresistive effect element and is positioned at a different level from the substrate by the resin being interposed between the magnetic field generator and the magnetoresistive effect element.

2. The magnetic sensor device according to claim 1, wherein:
the magnetoresistive effect element is configured in a meandering shape having a plurality of long parts that have first ends and second ends and are arranged in parallel to a prescribed direction and folded parts that are continuous between the first ends or the second ends of two long parts adjacent in the parallel direction of the long part; and
the magnetic field generator is positioned close to the folded parts.

3. The magnetic sensor device according to claim 2, wherein:
the magnetoresistive effect element is configured in the meandering shape so that the plurality of folded parts that are continuous between the first ends or the second ends of the long parts are arranged in parallel to a prescribed direction; and
the magnetic field generator is positioned close to the plurality of folded parts.

4. The magnetic sensor device according to claim 3, wherein the magnetic field generator is positioned close to the plurality of folded parts along the direction parallel to the plurality of folded parts.

5. The magnetic sensor device according to claim 1, wherein the magnetic field generator is positioned at a prescribed gap above the magnetoresistive effect element positioned on the substrate.

6. The magnetic sensor device according to claim 1, wherein the magnetoresistive effect element is a TMR element or a GMR element.

7. A magnetic sensor device, comprising:
a spin-valve-type magnetoresistive effect element;
a substrate on which the magnetoresistive effect element is positioned;
a power source that supplies a substantially constant electric current applied on the magnetoresistive effect element; and
a magnetic field generator that is connected in series to the electric current path of the electric current applied on the magnetoresistive effect element and that is provided to be capable of applying a bias magnetic field on at least a portion of the magnetoresistive effect element;
wherein the magnetic field generator is configured in a meandering shape having a plurality of long parts that have first ends and second ends and are arranged in parallel to a prescribed direction and folded parts that are continuous between the first ends or the second ends of two long parts adjacent in the parallel direction of the long part,
the magnetic field generator is close to the folded parts of the magnetoresistive effect element and is positioned at a different level from the substrate,
the magnetoresistive effect element has a plurality of magnetoresistive effect laminated bodies positioned in an array with a plurality of rows and a plurality of columns and a plurality of lead electrodes that connect the plurality of magnetoresistive effect laminated bodies in a meandering shape in series;
the lead electrodes include a first lead electrode, which connects the plurality of magnetoresistive effect laminated bodies arranged in parallel to a first direction in series, and a second lead electrode, which connects the magnetoresistive effect laminated bodies positioned at both ends in the first direction in a second direction orthogonal to the first direction;

the long part is configured by a plurality of magnetoresistive effect laminated bodies arranged in parallel to the first direction and the first lead electrode; and the folded parts are configured by the magnetoresistive effect laminated bodies positioned at both ends in the first direction and the second lead electrode.

8. The magnetic sensor device according to claim 7, wherein the shape of the second lead electrode in a plan view is approximately U-shaped.

9. The magnetic sensor device according to claim 7, wherein: the magnetoresistive effect element is configured in the meandering shape so that the plurality of folded parts that are continuous between the first ends or the second ends of the long parts are arranged in parallel to a prescribed direction; and the magnetic field generator is positioned close to the plurality of folded parts.

10. The magnetic sensor device according to claim 9, wherein the magnetic field generator is positioned close to the plurality of folded parts along the direction parallel to the plurality of folded parts.

11. The magnetic sensor device according to claim 7, wherein the magnetic field generator is positioned at a prescribed gap above the magnetoresistive effect element positioned on the substrate.

12. The magnetic sensor device according to claim 7, further comprising a sealing part that integrally seals at least the magnetoresistive effect element and the magnetic field generator with resin; wherein the magnetic field generator is positioned at a level differing from the substrate by the resin being interposed between the magnetic field generator and the magnetoresistive effect element.

13. The magnetic sensor device according to claim 7, wherein the magnetoresistive effect element is a TMR element or a GMR element.

* * * * *